United States Patent
Kasperkovitz

(10) Patent No.: US 7,429,889 B2
(45) Date of Patent: Sep. 30, 2008

(54) CONTROL SYSTEM FOR PROGRAMMABLE FILTERS

(75) Inventor: Wolfdietrich Georg Kasperkovitz, Waalre (NL)

(73) Assignee: Semiconductor Ideas to Market (ITOM) B.V., Breda (NL)

( * ) Notice: Subject to any disclaimer, the term of this patent is extended or adjusted under 35 U.S.C. 154(b) by 111 days.

(21) Appl. No.: 10/570,642

(22) PCT Filed: Sep. 5, 2004

(86) PCT No.: PCT/EP2004/009871

§ 371 (c)(1),
(2), (4) Date: Jun. 8, 2006

(87) PCT Pub. No.: WO2005/025062

PCT Pub. Date: Mar. 17, 2005

(65) Prior Publication Data

US 2007/0008030 A1    Jan. 11, 2007

(30) Foreign Application Priority Data

Sep. 5, 2003    (EP)    ................. 03077792

(51) Int. Cl.
*H03B 1/00*    (2006.01)
*H03K 5/00*    (2006.01)
*H04B 1/10*    (2006.01)

(52) U.S. Cl. ............. 327/552; 327/553; 327/554; 327/555; 327/556; 327/557; 327/558; 327/559

(58) Field of Classification Search ............. 375/295; 327/552–559
See application file for complete search history.

(56) References Cited

U.S. PATENT DOCUMENTS 3,775,768 A * 11/1973 Lisle et al. ................. 342/101
(Continued)

FOREIGN PATENT DOCUMENTS

EP    0579875    1/1994

OTHER PUBLICATIONS

Katsuji Kimura, "An MOS OTA and an MOS Four-Quadrant Analog Multiplier Using the Quadritail Cell", IEICE Trans. Fundamentals, vol. E75-A, No. 12 pp. 1774-1776, Dec. 1992.*
(Continued)

*Primary Examiner*—Quan Tra
*Assistant Examiner*—Daniel Rojas
(74) *Attorney, Agent, or Firm*—Robert M. McDermott, Esq.

(57) ABSTRACT

Control system for programmable filters, master-slave calibration system and fully programmable high precision filter for use in such control system, such filters being provided with a filter input and a filter output including a first, first order low pass filter section comprising first and second mutually identical operational transconductance amplifiers (OTAs), having a controllable transconductance Gm from a differential voltage input having first and second differential voltage input terminals to a single current output carrying a single phase current output signals, said first and second OTAs being provided with first and second control inputs, respectively, said filter input being coupled to the first differential voltage input terminal of said first OTA. The current outputs of both first and second OTAs are being resistorless coupled to a first capacitor, the current output of the second OTA is negatively fed back to its first differential voltage input terminal to form a variable positive virtual resistance across said first capacitor, the common connection of the single current outputs of the first and second OTAs and the first capacitor constituting an output terminal of the first, first order low pass filter section, which is coupled to said filter output, the second differential voltage input terminals of the first and second OTAs being respectively coupled to first and second DC reference voltage levels, a gain and a bandwidth control signal being respectively supplied to the first and second control input terminals of said first and second OTA. To obtain an unambiguous and orthogonal control of filter parameters, such as gain, bandwidth, quality factor and/or tuning frequency, said gain control signal is provided through a first multiplier to said first control input terminal of the first, first order low pass filter section for multiplying the gain control signal with said bandwidth control signal and said bandwidth control signal at least to said second control input terminal of the first, first order low pass filter section.

20 Claims, 12 Drawing Sheets

U.S. PATENT DOCUMENTS

| | | |
|---|---|---|
| 5,220,686 A | 6/1993 | Kasperkovitz et al. |
| 5,317,217 A | 5/1994 | Rieger et al. |
| 6,011,431 A | 1/2000 | Gilbert |
| 6,963,252 B2 | 11/2005 | Kasperkovitz |

OTHER PUBLICATIONS

Geiger et al, Active Filter Design Using Operational Transconductance Amplifiers: A Tutorial; IEEE Circuits and Devices Magazine, New York, N.Y., Mar. 1985.

Lee et al, Design Techniques for Low-Voltage VHF CMOS Transconductance-Filteres With Automatic Tuning, IEEE International Symposium on Circuits and Systems, Geneva, Switzerland, May 2000.

Salmeh et al, A Low Voltage Linearly Tuned Fully Differential CMOS OTA and Its Applications in Filter Design, IEEE Canadian Conference on Electical and Computer Engineering, 2002.

Shana'a, O.; Low-Voltage Current-Mode CMOS IC Continuaous-Time Filters With Orthogonal $w_0$-Q Tuning, IEEE, 1998.

Wyszynski et al, Frequency and Phase Tuning of Continuous-Time Integrated Filers Using Common-Mode Signals, Dept. of Engineering, Portland State University, Portland, Oregon, no date.

* cited by examiner

CONTROL SYSTEM FOR PROGRAMMABLE FILTERS

The invention relates to a control system for programmable filters and fully programmable high precision filters for use in such control system, such filters having a filter input and a filter output including a first, first order low pass filter section comprising first and second mutually identical operational transconductance amplifiers (OTAs), each OTA having a differential voltage input with first and second differential voltage input terminals and a single current output carrying a single phase current output signal, said first and second OTAs each having a controllable transconductance Gm from said differential voltage input to said single current output and being provided with first and second control inputs, respectively, said filter input being coupled to the first differential voltage input terminal of said first OTA, characterized by the current outputs of both first and second OTAs being resistorless coupled to a first capacitor, the current output of the second OTA being negatively fed back to its first differential voltage input terminal to form a variable positive virtual resistance across said first capacitor, the common connection of the single current outputs of the first and second OTAs and the first capacitor constituting an output terminal of the first, first order low pass filter section, which is coupled to said filter output, the second differential voltage input terminals of the first and second OTAs being respectively coupled to first and second DC reference voltage levels, a gain and a bandwidth control signal being respectively supplied to the first and second control input terminals of said first and second OTA.

Such filters are known, e.g. from the Article "Active Filter Design Using Operational Transconductance Amplifiers: A Tutorial" by Geiger R. L. et al, published in IEEE Circuits and Devices Magazine, IEEE Inc. New York, US dated 1 Mar. 1985, pages 20-32, XP002015888, ISSN: 8755-3996. The known filters are gain and bandwidth controllable, however, variation of the controllable transconductance Gm of the first OTA not only causes the overall filter gain to vary, but also affects the bandwidth, whereas variation of the controllable transconductance Gm of the second OTA not only causes the bandwidth to vary, but also affects the overall filter gain.

It is an object of the invention to offer a control system for fully programmable, high precision analogue filters, providing an unambiguous and orthogonal control of filter parameters, such as gain, bandwidth, quality factor and/or tuning frequency with bandpass filters and corner frequency with lowpass filters, by means of (software) programmable digital or analogue control signals with a performance comparable to programmable digital filters.

Now therefore, according to one of its aspects, the invention is characterized by a control signal device receiving said gain and bandwidth control signals and providing said gain control signal through a first multiplier to said first control input terminal of the first, first order low pass filter section for multiplying the gain control signal with said bandwidth control signal and providing said bandwidth control signal at least to said second control input terminal of the first, first order low pass filter section.

By applying the measure according to the invention, the controllable virtual resistor is being realized by means of the second OTA, the transconductance thereof being varied such that said first, first order low pass filter section is set at a desired bandwidth, or corner frequency. The control signal needed to obtain said desired bandwidth, or corner frequency inherently compensates for any unwanted spread and parasite related DC offset. The first OTA is being used to vary the overall gain of said first, first order low pass filter. Influences of the gain control on the bandwidth and vice versa are strongly reduced in accordance with the invention by varying the transconductance of the first OTA with the product of the gain and bandwidth control signals while varying the transconductance of the second OTA with the bandwidth control signal only. The DC reference voltages at the non-signal bearing input terminals of the first and second OTAs are to set the average input, respectively output signal level. Said first, first order low pass filter section is therewith highly accurately and unambiguously orthogonally controllable or programmable in all its filter characteristics, and fully suited to be used as low pass Gm/C cell or building block filter in fully programmable high precision filters. Such low pass building block filter may be applied, either singular, or repetitive within an arrangement of similar building block filter sections allowing to implement higher order low pass, high pass, bandpass or all pass filter characteristics. The invention therewith enables to achieve its abovementioned objects.

The invention also relates to fully programmable high precision filters for use in an orthogonal gain-bandwidth control system.

An embodiment of a fully programmable high precision second order low pass filter according to the invention providing selective quadrature splitting and accurately controllable in gain and bandwidth is characterized by a second-order low pass-filter section comprising a cascade connection of said first, first order low pass filter section with an identical second, first order low pass filter section comprising a second capacitor, identical to the first capacitor, the first control input terminal of at least the first, first order low pass filter section being supplied with said gain control signal, the second control input terminal of both first and second, first order low pass filter sections being supplied with said bandwidth control signal.

An embodiment of a fully programmable high precision selective, tuneable band pass quadrature splitter according to the invention is characterized by said filter input being coupled in common to said first, first order low pass filter section and a third, first order low pass filter section, which is identical to said first, first order low pass filter section and comprises a third capacitor, identical to the first capacitor, output terminals of the first and third, first order low pass filter sections being coupled to first and second voltage input terminals of first and second tuning control OTAs respectively, said first and second tuning control OTAs being identical to each of the OTAs of the first and third, first order low pass filter sections and being negatively fed back through its current outputs to the first voltage input terminals of the second OTAs of the third and first, first order low pass filter sections, respectively, the second and first voltage input terminals of said first and second tuning control OTAs being coupled to a third DC voltage reference level, the first OTAs of the first and third, first order low pass filter sections being supplied with said gain control signal, the second OTAs of the first and third, first order low pass filter sections being supplied with a bandwidth control signal, and said first and second tuning control OTAs being supplied with a tuning control signal.

An embodiment of a fully programmable high precision second order filter according to the invention implemented by a high degree of repetitive use of identical circuitry is characterized by an output terminal of the second, first order low pass filter section being fed back through a feed back OTA to the common connection between the output terminal of the first, first order low pass filter section and an input terminal of the second, first order low pass filter section, said feed back OTA being identical to each of the OTAs of the first and second first order low pass filter sections and being supplied with a feedback control signal through a feedback control signal terminal.

To optimize the filter characteristic of the above embodiment of the invention in low pass implementation as to maximum slope and minimum ripple said control signal device comprises means for providing said bandwidth control signal in common to said second control input terminal of the first, first order low pass filter sections, said first and second control input terminals of the second, first order low pass filter section and said feedback control signal terminal.

To obtain a tunable band pass implementation of the above embodiment according to the invention, said control signal device preferably comprises means for providing said bandwidth control signal in common to the second control input terminals of the first and second, first order low pass filter sections, said control signal device receiving a tuning control signal substantially larger than said bandwidth control signal and comprising means for providing said tuning control signal in common to the first control input terminal of the second, first order low pass filter section and said feedback control signal terminal.

An embodiment of the last mentioned fully programmable high precision bandpass filter according to the invention with orthogonal tuning/bandwidth control is preferably characterized by said bandwidth control signal being provided through a second multiplier to said feedback control signal terminal for multiplying the bandwidth control signal with said tuning control signal.

The invention also relates to a control system for programmable filters based on master-slave calibration, comprising a master filter providing at least one parameter calibration signal to a slave filter device. Such a master-slave calibration system is on itself known e.g. from the above cited U.S. Pat. No. 6,011,431. This known master-slave calibration system, however, limits calibration of the slave filter device to only one single filter characteristic, namely the tuning frequency.

In order to achieve in particular the abovementioned fourth object, the master filter device of the master-slave calibration system provides a frequency calibration signal to a slave filter device and is characterized according to the invention by said slave filter device and said master filter device respectively comprising N and M of the above known fully programmable high precision filters, said M fully programmable high precision filters of the master filter device being arranged in a regenerative feed back loop to constitute a master oscillator generating a master oscillator signal, said master oscillator signal being frequency locked to a reference frequency through a a phase or frequency locked loop (PLL/FLL) carrying a PLL/FLL signal being fed back to a bandwidth and/or tuning control terminal of said master filter device and providing said frequency calibration signal, an automatic gain control (AGC) loop carrying an AGC signal derived from an output amplitude of the master filter device and being fed back to a gain control terminal of the master filter device, providing a gain calibration signal, said PLL/FLL signal and said AGC signals calibrating the phase shift and gain within said regenerative feed back loop to meet oscillation conditions at said reference frequency, said frequency calibration signal and/or said gain calibration signal being coupled to said N fully programmable high precision filters of the slave filter device for a bandwidth, tuning and/or gain calibration thereof.

By applying these measures according to the invention, all spread and parasites caused inaccuracies in all variable filter parameters are being eliminated by the frequency and gain calibration of the slave filter device with the master device.

Dependent on the application, one or more of the N fully programmable high precision filters of the slave filter device may be supplied with an external or circumstantial bandwidth or tuning and/or gain control signal in addition to a frequency and gain calibration signals, e.g. in the IF part of FM receivers with dynamic adjacent channel suppression.

To allow for the N fully programmable high precision filters of the slave filter device mutually differing in (bandpass, band rejection, all pass, low pass) filter type, filter frequency characteristics, such as tuning or corner frequency and/or bandwidth while maintaining high precision filter characteristics, these N fully programmable high precision filters may mutually as well as with respect to the M fully programmable high precision filters of the master filter device differ in Gm/C value by predetermined scaling factors and are identical in the IC topology of their respective first order low pass filter sections.

The identical IC topology of the first order low pass building block filters used in the master and slave filter devices prevent the filter characteristics from being influenced by spread and other technology related sources of inaccuracy, whereas the desired Gm/C value for the specific N fully programmable high precision filters of the slave filter device with respect to the M fully programmable high precision filters of the master filter device can be obtained without affecting the high precision control in filter characteristics, by appropriate proportionalities in control or circuit parameters, such as control voltages and/or currents, or dimensions or sizes of circuit elements or IC lay out features, such as resistor arrays, emitter surfaces, channel width.

An embodiment of a master-slave calibration system having a master filter device including a single (i.e. M=1) fully programmable high precision filter according to the invention is characterized by said fully programmable high precision filter being positively fed back from its output to its input to form said regenerative feed back loop and phase and gain controlled through said PLL/FLL and AGC signals to meet oscillation conditions at said reference frequency.

The state of oscillation is well defined in gain and phase shift. By coupling the master oscillator signal to said reference frequency, a reliable unambiguous basis for gain and frequency calibration is obtained.

An embodiment of a master-slave calibration system according to the invention which is easily to be implemented and secures accurate calibration of both master and slave filter devices, is characterized by the master filter device comprising a cascade arrangement of an even number of first order low pass filter sections, each being identical to the above first, first order low pass filter section of the fully programmable high precision filter, said PLL/FLL signal and said AGC signal being supplied to each of said even number of first order low pass filter sections for bandwidth and gain calibration.

An embodiment of a master-slave calibration system according to the invention is characterized by a divider deriving said frequency calibration signal from said PLL/FLL signal and a predetermined filter quality factor Q in accordance with the quotient fbw=fc/Q, said frequency calibration signal being supplied to a bandwidth control terminal of said slave filter. This measure provides stabilization of said filter quality throughout the bandwidth control range.

An embodiment of a master-slave calibration system according to the invention is characterised by a divider deriving said frequency calibration signal from said PLL/FLL signal and a predetermined filter quality factor Q in accordance with the quotient fbw=fc/Q, said frequency calibration signal being supplied to a bandwidth control terminal of said slave filter. This measure provides stabilisation of said filter quality throughout the bandwidth control range.

An embodiment of a master-slave calibration system according to the invention is characterised by a derivation of a quality control signal from said PLL/FLL signal through a fixed current ratio.

By scaling of the individual fully programmable high precision filters of the slave filter device with the master slave filter in Gm/C value accurate and unambguous filter tracking is obtained independent from the actual tuning frequency, gain, bandwidth, order and/or type (i.e. low pass, high pass, bandpass, band rejection, or all pass) of the individual filter characteristics of said slave filters. The N fully programmable high precision filters within said slave filter device can be set at N different filter characteristcs while being fully calibrated with the first order low pass filter sections of the master filter device.

Therefore, an embodiment of a master-slave calibration system according to the invention is characterised by said frequency and gain calibration signals calibrating the OTAs of the N fully programmable high precision filters of the slave filter device in their Gm/C value at predetermined scaling factors with respect to the Gm/C value of the OTAs each of the first order low pass filter sections of the master filter device. By this measure accurate Gm/C matching of each of the N fully programmable high precision filters within said slave filter device with the first order low pass filter sections of said master filter device is being obtained at any set value of the control signals within their full control range through scaling of gm/C by a scaling factor, i.e. scaling of the current control signals of the OTAs and/or the capacitance value C.

An embodiment of a master-slave calibration system according to the invention is characterised by an implementation in bipolar IC technology, said scaling factor being determined by a fixed gain control current and/or capacitance ratio.

An embodiment of a master-slave calibration system according to the invention is characterised by an implementation in metal oxide silicium (MOS) technology, said scaling factor being determined by a ratio in channel width of the first order low pass filter sections of the N fully programmable high precision filter of the slave filter device.

An embodiment of a master-slave calibration system according to the invention is characterised by an implementation in metal oxide silicium (MOS) technology, said scaling factor being determined by a ratio in numbers of identical first order low pass filter sections being arranged in shunt in one or more of the N fully programmable high precision filter of the slave filter device.

By applying one or both of these last two measures, gm/C scaling is obtained by scaling in width and/or shunt arrangements of various identical first order low pass filter sections in master and slave filter devices. This results in accurate matching of each of the N fully programmable high precision filters within said slave filter device with the first order low pass filter sections of said master filter device is being obtained at any set value of the control signals within their full control range, despite the non-linear control of transconductance of OTAs when being implemented in metal oxide silicium (MOS) technology.

These and further aspects and advantages of the invention will be discussed more in detail hereinafter with reference to the disclosure of preferred embodiments, and in particular with reference to the appended Figures in which like reference numerals refer to like elements, wherein.

Figure 1:
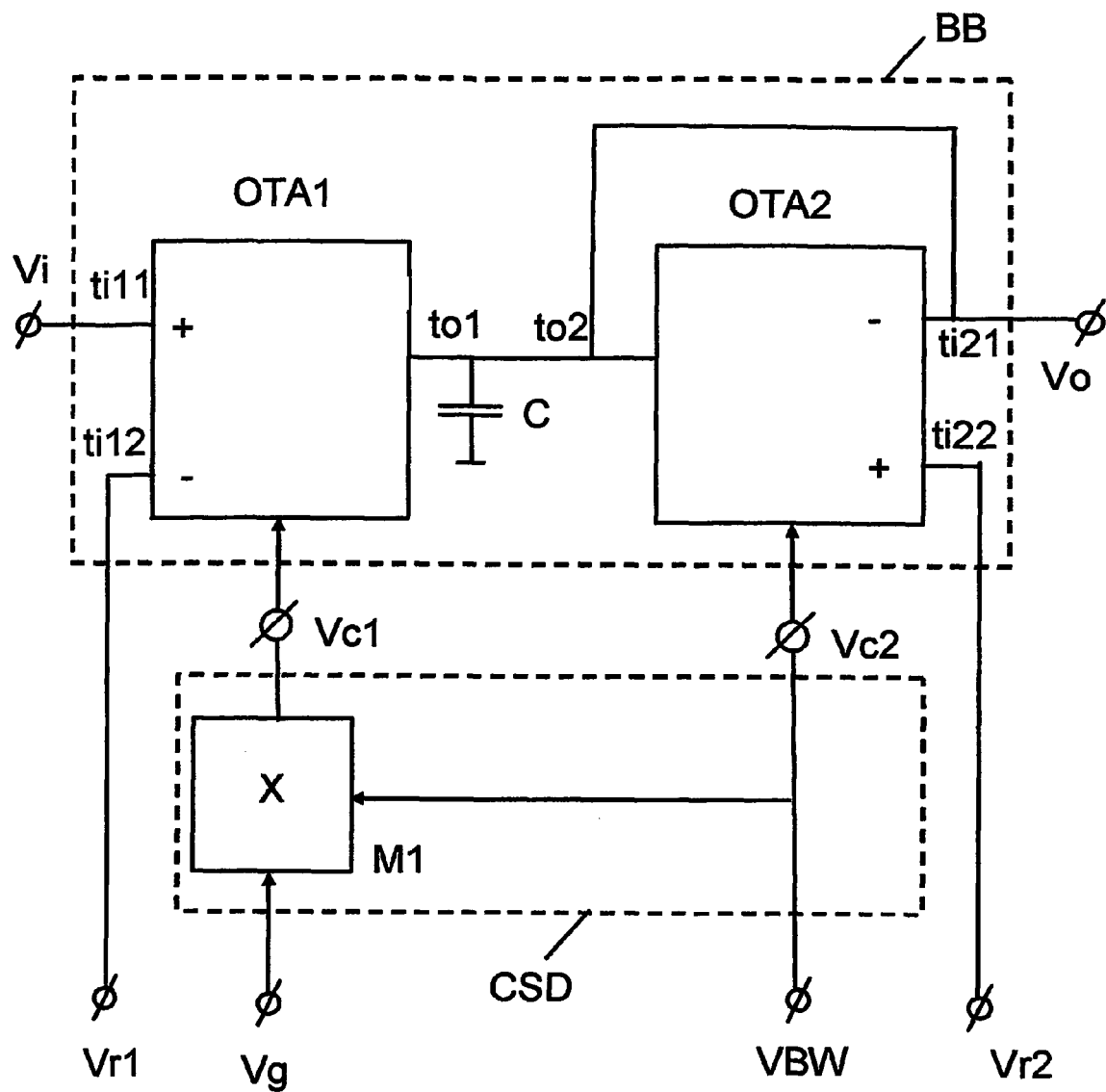
FIG. 1 shows a control system for programmable filters according to the invention applied to a known, fully programmable high precision filter consisting of a first order low pass filter section providing a single ended building block.

FIG. 1 shows a control system for programmable filters according to the invention applied to a known, fully programmable high precision filter consisting of a first order low pass filter section providing a single ended building block, hereinafter also being referred to as Gm/C cell or first, first order low pass building block filter BB. Said building block filter BB is provided with a filter input Vi and a filter output Vo and comprises first and second mutually identical, operational transconductance amplifiers OTA1 and OTA2, respectively. OTA1 and OTA2, each providing a controllable transconductance Gm from a differential voltage input having first and second differential voltage input terminals ti11, ti12 and ti21, ti22, to a single ended current output to1 and to2, respectively. OTA1 and OTA2 each supply a single phase current output signal through their single-ended current outputs to1 and to2. The transconductance Gm of OTA1 and OTA2 is controllable by means of control signals being supplied to first and second control inputs Vc1 and Vc2, respectively. Said filter input Vi is being coupled to the first differential voltage input terminal ti11 of OTA1. According to the invention, the current outputs of both OTA1 and OTA2 are resistorless coupled to a capacitor C, i.e. coupled to said capacitor C without using any physical resistor. The current output to2 of OTA2 is negatively fed back to its first differential voltage input terminal ti21 to form a variable positive virtual resistance across said capacitor C. The common connection of the single current outputs to1 and to2 of OTA1 and OTA2 and the capacitor C constitutes an output terminal of the first order low pass building block filter BB, which in the embodiment shown coincides with said filter output Vo. The second differential voltage input terminals ti12 and ti22 of OTA1 and OTA2 are respectively coupled to first and second DC reference voltage levels Vr1 and Vr2.

The current output of any OTA is inherently resistorless. By avoiding the use of any physical resistor in coupling said first capacitor to the current output and by shunting said first capacitor with a controllable virtual resistor instead, unpredictable spread and parasite related inaccuracies due to such physical resistor is prevented from occurring, whereas any DC offset across the first capacitor can be compensated by an appropriate control of the virtual resistor.

By varying the transconductance of the second OTA with the bandwidth control signal, the first, first order low pass filter section BB is set at a desired bandwidth, or corner frequency. This bandwidth control signal inherently compensates for any unwanted spread and parasite related DC offset. The first OTA is being used to vary the gain of said first, first order low pass filter. The DC reference voltages at the non-signal bearing input terminals of the first and second OTAs are to set the average input, respectively output signal level. Said first, first order low pass filter section BB is therewith highly accurately and unambiguously controllable or programmable in all its filter characteristics, and fully suited to be used as low pass Gm/C cell or building block filter in fully programmable high precision filters. Such low pass building block filter may be applied, either singular, or repetitive within an arrangement of similar building block filter sections allowing to implement higher order low pass, high pass, bandpass or all pass filter characteristics as will be shown hereinafter.

For a proper understanding of the invention it suffices to know that all OTAs used have mutually identical circuit implementation. Any type of OTA meeting the above definition in having a differential voltage input and a single current output, and providing a controllable transconductance Gm from said differential voltage input to said single current output, can be used to properly apply the invention. OTAs which may well be used in accordance with the invention are known from e.g. National Semiconductor Datasheet on IC type LM13700 Dual Operational Transconductance Amplifiers with Linearizing Diodes and Buffers, or U.S. Pat. Nos. 6,011,431 and 5,317,217.

The fully programmable high precision filter shown in this FIG. 1 comprises a control signal device CSD receiving gain and bandwidth control signal Vcg and Vcbw at its gain and bandwidth control signal inputs Vg and Vbw for deriving therefrom control signals to be supplied to the first and second control inputs, Vc1 and Vc2 of OTA1 and OTA2, to control the gain and bandwidth of the first order low pass building block filter BB. The gain control signal Vcg is being provided from said gain control signal input Vg to said first control input terminal Vc1 of the first order low pass building block filter BB through a first multiplier M1 for multiplying said gain control signal Vcg with said bandwidth control signal Vcbw into Vcg*Vcbw. Apart therefrom, the control signal device CSD passes through the bandwidth control signal Vcbw to the second control input terminal Vc2 of the first order low pass filter section BB. By supplying said product Vcg*Vcbw to the first control input terminal Vc1 of the first, first order low pass filter section BB instead of the gain control signal Vcg itself, the gain of the first order low pass building block filter BB is controllable independent from the control of the bandwidth thereof, i.e. an orthogonal gain-bandwidth control is being obtained.

Figure 2:
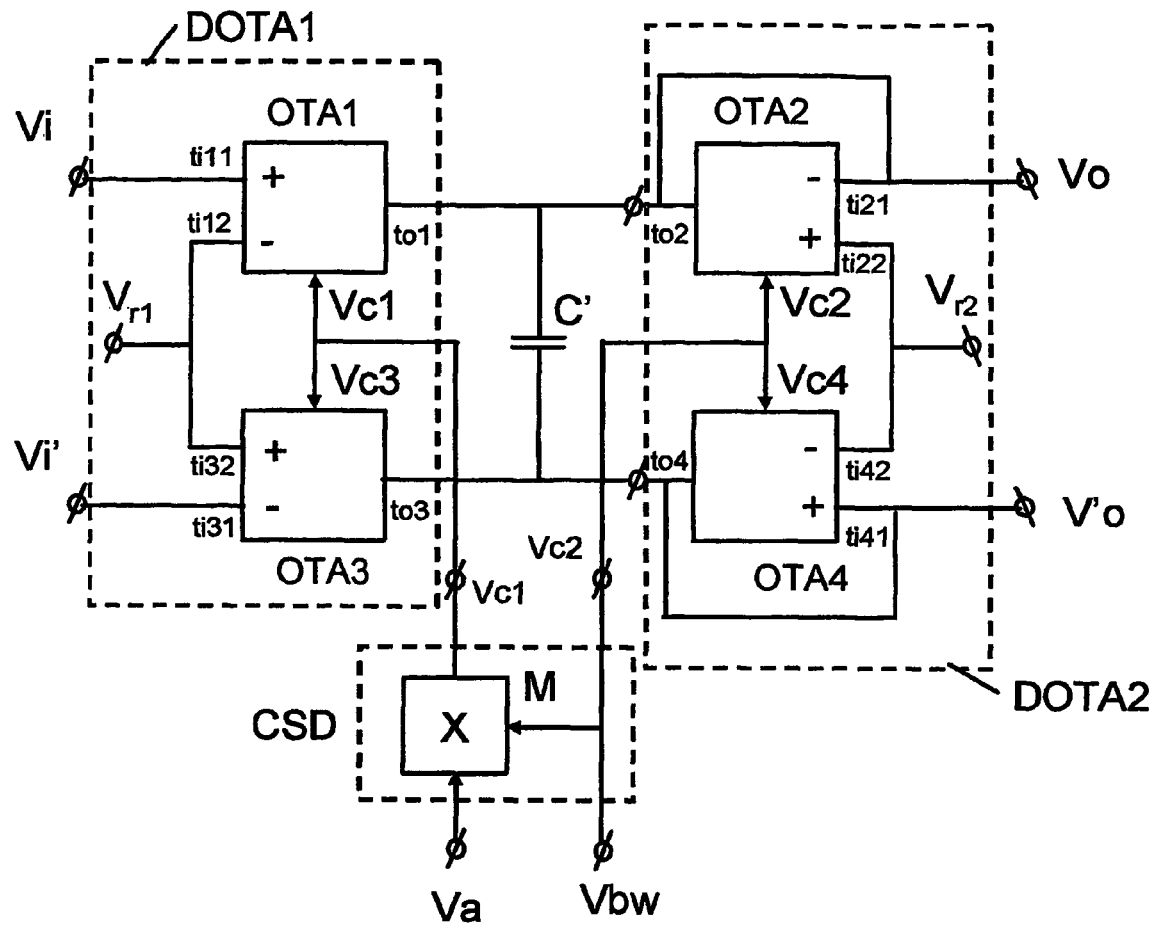
FIG. 2 shows a control system for differential programmable filters according to the invention.

FIG. 2 shows a control system for differential programmable filters according to the invention, such differential programmable filters including a differential version of a first order low pass filter section for use as a differential building block DBB. Said differential first order low pass filter section comprises third and fourth OTAs, OTA3 and OTA4 respectively, being identical to each of said OTA1 and OTA2, respectively. OTA3 and OTA4 have control input terminals in common with the first and second control input terminals Vc1 and Vc2 of OTA1 and OTA2, respectively. OTA1 and OTA3 are arranged to form a first differential OTA, hereinafter referred to as DOTA1, having a differential voltage input Vi and Vi' being constituted of said first differential voltage input terminals ti11 and ti31 of OTA1 and OTA3, respectively, and a differential current output being constituted of the single current outputs to1 and to3 of OTA1 and OTA3. Similarly, OTA2 and OTA4 are being arranged to form a second differential OTA, hereinafter referred to as DOTA2, having a differential voltage input comprising the first differential voltage input terminals ti21 and ti41 of OTA2 and OTA4 and a differential current output comprising the single current outputs to2 and to4 of OTA2 and OTA4 respectively. A capacitor C', which may be chosen at half the capacitance of the capacitor C of the fully programmable high precision filter of FIG. 1, is being resistorless coupled between the common connection of the single current outputs to1 and to2 of OTA1 and OTA2 on the one hand and the common connection of the single current outputs to3 and to4 of OTA3 and OTA4 on the other hand. Said common connections respectively constitute first and second differential voltage output terminals Vo and Vo' of the differential first order low pass filter section DBB. OTA2 and OTA4 are each negatively fed back from their single current outputs to2 and to4 to their first voltage input terminals, ti21 and ti41, respectively, to each form a variable positive virtual resistance across said capacitor C'. The second voltage input terminals ti12 and ti32 of OTA1 and OTA3, respectively the second voltage input terminals ti22 and ti42 of OTA2 and OTA4 are being coupled in common to the first, respectively the second, DC reference voltage levels Vr1 and Vr2. The first control input terminals Vc1 and Vc3 of both OTA1 and OTA3 of DOTA1, are being supplied in common with the product of gain and bandwidth control signals Vcg*Vcbw from the control signal device CSD, similar to the fully programmable high precision first order low pass filter of FIG. 1. The second control input terminals Vc2 and Vc4 of both OTA2 and OTA4 of DOTA2 are supplied in common with the bandwidth control signal Vcbw.

Figure 4A:
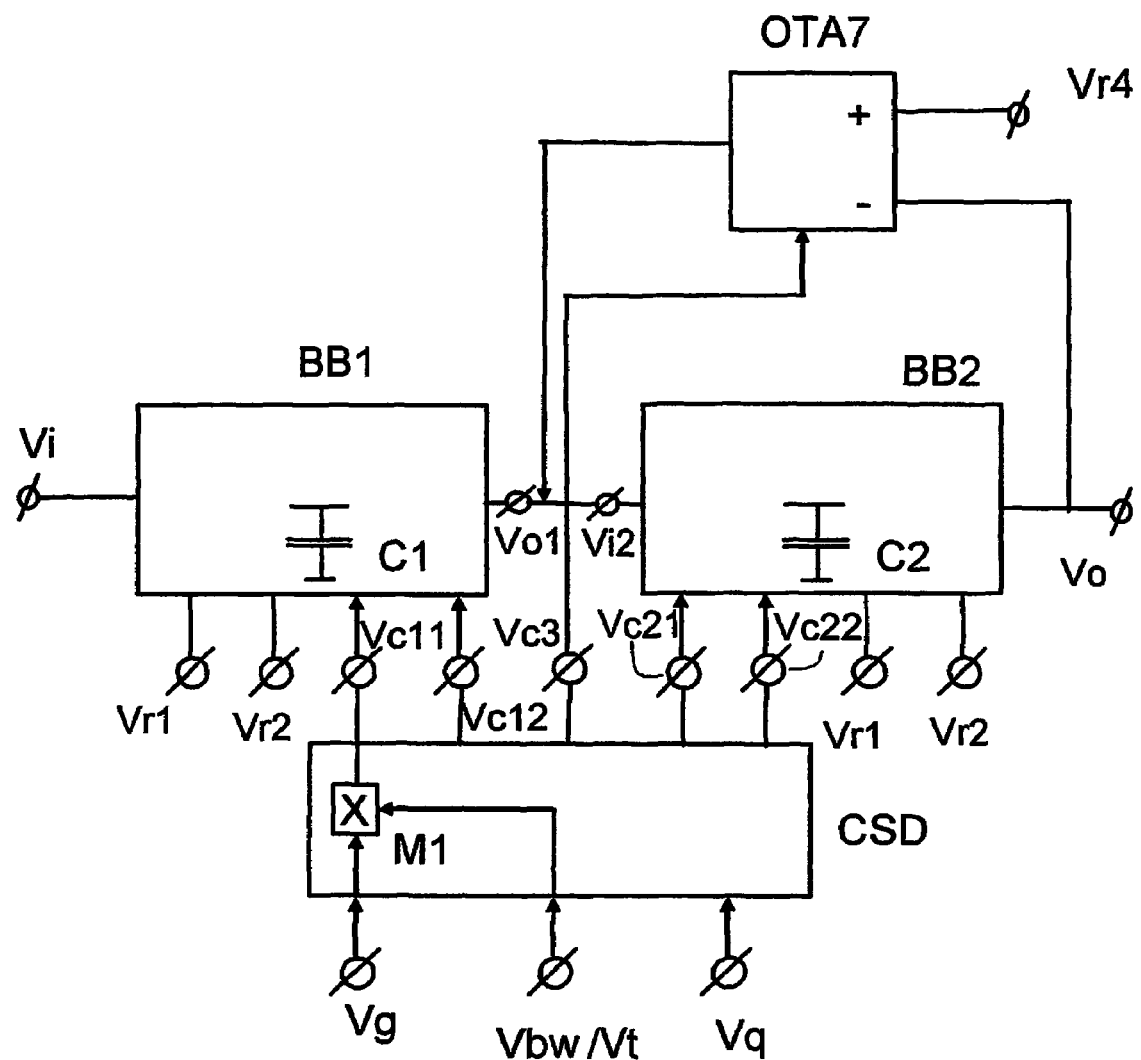
FIG. 4A shows a second order fully programmable high precision filter according to the invention, being constitued with two single first order low pass filter sections and a feedback loop including an OTA for Q or tuning frequency control.

A fully programmable high precision second order low pass filter according to the invention is shown in FIG. 4A and obtained by first and second first order low pass building block filters BB1 and BB2 being cascaded through filter output Vo1 of BB1 and filter input Vi2 of BB2, each BB1 and BB2 being identical to the above first order low pass buiding block filter BB of FIG. 1 and each comprising first and second OTAs identical to the above OTA1 and OTA2 of said FIG. 1, and respective first and third capacitors C1 and C2, each identical to the above capacitor C. The cascade arrangement of BB1 and BB2 is connected between single ended filter input Vi and filter output Vo. The second voltage input terminals ti12 of OTA1 in both BB1 and BB2, respectively, the second voltage input terminals ti22 of OTA2 in both BB1 and BB2, are being coupled in common to the first, respectively the second, DC reference voltage levels Vr1 and Vr2.

BB1 and BB2 are provided with first and second control input terminals Vc11, Vc12 and Vc21, Vc22, respectively. The cascade connection of BB1 and BB2 is being controlled in gain and bandwidth similar to the first order low pass building block filters BB of FIGS. 1 and 2, in that the first control input terminals Vc11 and Vc21 of both BB1 and BB2 are being provided in common with the product of gain and bandwidth control signals Vcg*Vcbw from the control signal device CSD, whereas the second control input terminals Vc12 and Vc22 of both BB1 and BB2 are being provided in common with said bandwidth control signal Vcbw.

Figure 3:
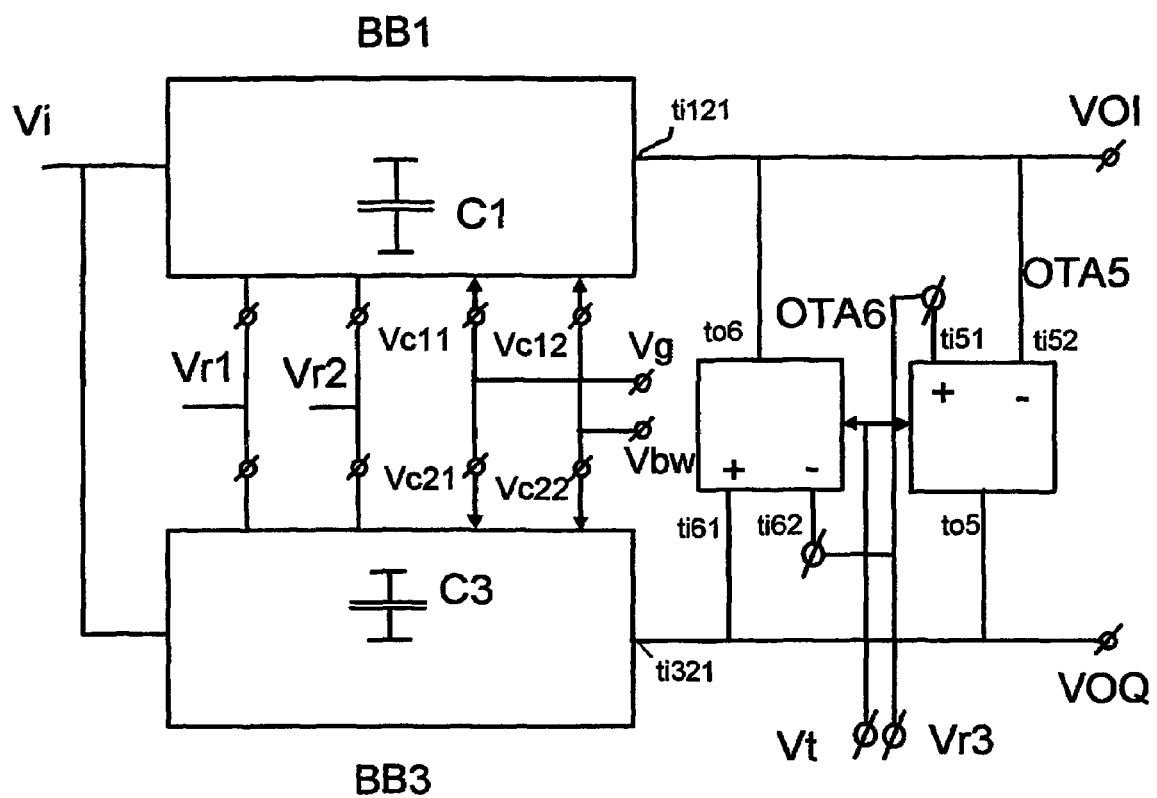
FIG. 3 shows a control system for programmable selective quadrature splitter filters according to the invention.

FIG. 3 shows a control system for programmable selective quadrature splitters according to the invention, such programmable selective quadrature splitter in accordance with an aspect of the invention using a fully programmable high precision filter having a filter input Vi being coupled in common with said first, first order low pass building block filter BB1 and a third, first order low pass building block filter BB3. Both BB1 and BB3 are identical to the above first order low pass building block filter BB and each comprise first and second OTAs identical to OTA1 and OTA2 of the above BB, and respective first and third capacitors C1 and C3, each identical to the above capacitor C of said BB. The second voltage input terminals ti12 of OTA1 in both BB1 and BB3, respectively, the second voltage input terminals ti22 of OTA2 in both BB1 and BB2, are being coupled in common to the first, respectively the second, DC reference voltage levels Vr1 and V2. Single output terminals of BB1 and BB3 constitute a pair of phase quadrature output terminals Voi and Voq of the selective quadrature splitter providing a pair of phase quadrature output signals. BB1 and BB3 are being coupled to second and first voltage input terminals ti52 and ti61 of fifth and sixth OTAs, OTA5 and OTA6, hereinafter also being referred to as first and second tuning control OTAs, respectively. OTA5 and OTA6 are each identical to each of the OTAs of BB1 and BB3 and are negatively fed back through its current outputs to5 and to6 to the first voltage input terminals ti121 and ti321 of the second OTAs of BB1 and BB3, respectively. The second and first voltage input terminals ti51 and ti62 of OTA5 and OTA6 are being coupled to a third DC voltage reference level Vr3, the first OTAs of BB1 and BB3 are supplied with the gain control signal Vcg, the second OTAs of BB1 and BB3 are supplied with the bandwidth control signal Vcbw, and OTA5 and OTA6 are supplied with a tuning control signal Vct. The so obtained quadrature splitter provides bandpass filter selection and quadrature splitting of a single phase input signal, the signal selection being orthogonally controllable in bandwidth, tuning frequency and gain.

FIG. 4A includes, apart from the above cascade arrangement of BB1 and BB2, in accordance with the invention, a feedback loop from the output of BB2, which in the embodiment shown coincides with the single ended filter output Vo, to its single ended input Vi2. The second voltage input terminals ti12 of OTA1 in both BB1 and BB2, respectively, the second voltage input terminals ti22 of OTA2 in both BB1 and BB2, are being coupled in common to the first, respectively the second, DC reference voltage levels Vr1 and Vr2. The feedback loop includes a feedback OTA, hereinafter also being referred to as seventh OTA or OTA7, which is identical to each of the OTAs of BB1 and BB2 and is being varied in its transconductance with a feedback control signal being supplied through a feedback control signal terminal Vc3.

The embodiment shown comprises a control signal device CSD, which—similar to the control signal device CSD of FIG. 1—receives said gain and bandwidth control signals Vcg and Vcbw to provide said gain control signal to said first control input terminal Vc11 of the first, first order low pass building block filter BB1 through a first multiplier M1 for multiplying the gain control signal Vcg with said bandwidth control signal Vcbw into Vcg*Vcbw. Dependent on the relative magnitude of the transconductances of OTA2 of BB1, OTA1 and OTA2 of BB1 and OTA7, the embodiment of a second order fully programmable high precision filter according to the invention of this FIG. 4 may have low pass or bandpass filter characteristic.

Figure 4B:
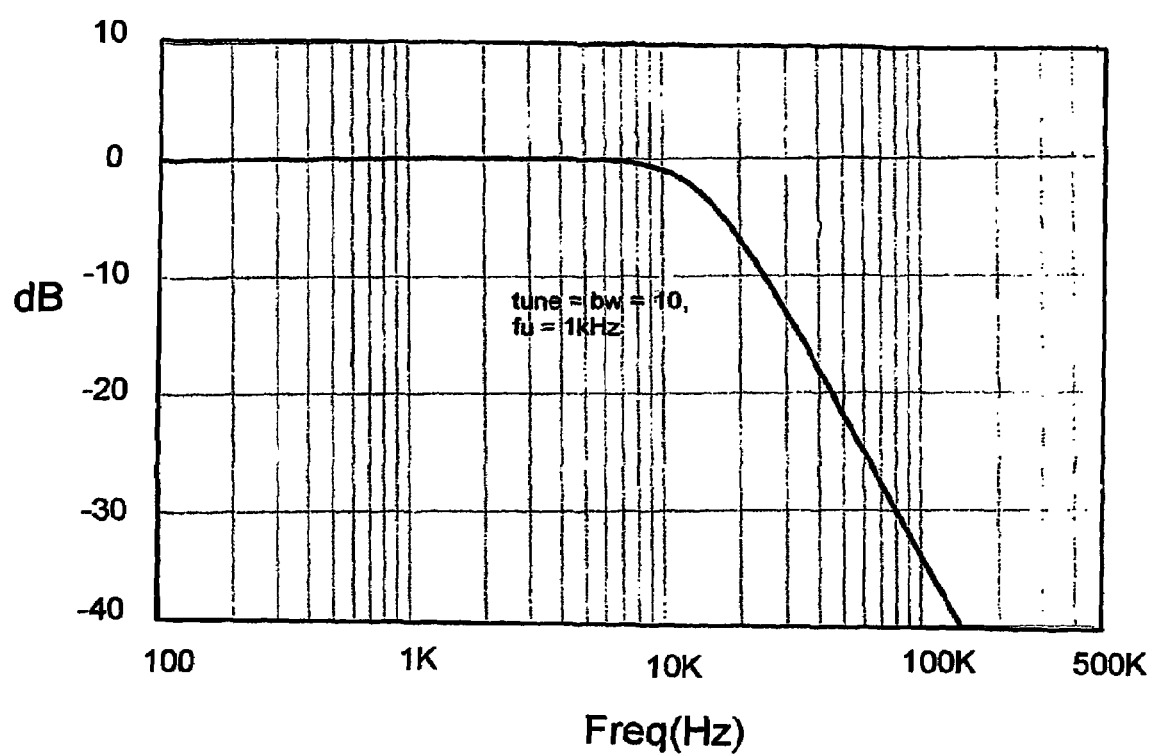
FIG. 4B shows a first characteristic of the second order fully programmable high precision filter dimensioned to operate as low pass filter.

For operation in low pass mode, the control signals supplied to OTA2 of BB1, OTA1 and OTA2 of BB1 and OTA7 should be mutually substantially equal. An optimization for minimum ripple and maximum slope is obtained when these control currents, i.e. the transconductances of said OTAs, are mutually equal. A signal plot representing the low pass filter transfer characteristics obtained at such optimized setting with Vcg=1, Vcbw=Vct=0,7, C=1 m/2π, is shown in FIG. 4B. Herein the 3 dB low pass bandwidth is 10 kHz, whereas the maximum slope amounts to f(−3 dB)/sqrt(2)/fu, in which fu=(½*π*C) with C=C1=C2.

Figure 4C:
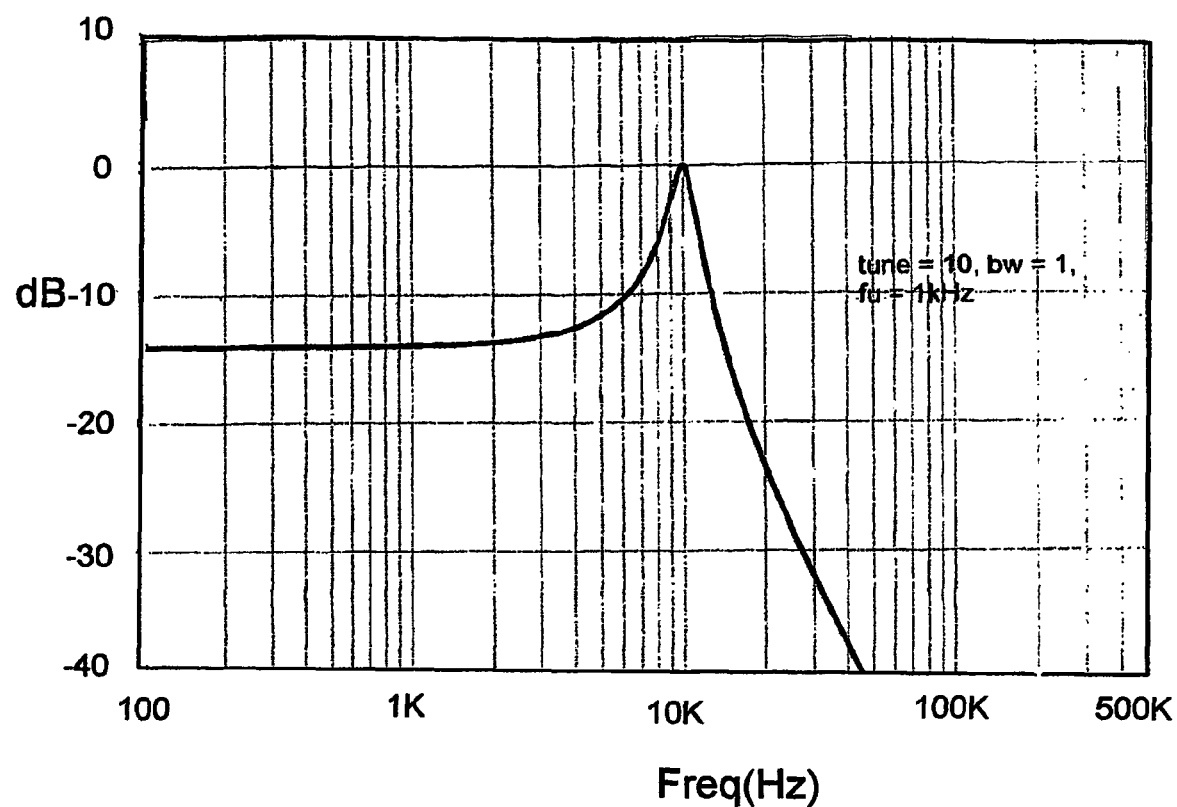
FIG. 4C shows a second characteristic of the second order fully programmable high precision filter dimensioned to operate as band pass filter.

For operation in band pass mode, the control signals supplied to OTA7 and OTA1 of BB2, i.e. the transconductances of said OTAs, should be mutually equal and substantially larger than the control signals supplied to OTA2 of BB1, i.e. the transconductances of said OTAs, these latter control signals being mutually substantially equal. A signal plot representing the bandpass filter transfer characteristics obtained at such setting of control signals is shown in FIG. 4C having a tuning frequency of 10 kHz and a bandpass width of 1 kHz. Said control signal device CSD preferably provides said bandwidth control signal through a second multiplier (not shown) to the feedback control signal terminal of OTA7 for multiplying the bandwidth control signal with said tuning control signal to stabilise the form and slope of the bandpass characteristic in band pass mode against tuning frequency variations.

These low pass and band pass operation modes can be realized with an appropriate coupling of the received gain, tuning and bandwidth control signals to the various control input terminals of the OTAs involved. Apart from the direct control of said filter characteristics the gain control signal Vcg can be derived from the bandwidth control signal Vcbw or vice versa such, that a wanted filter quality factor Q is secured for all values within the control range. For this purpose, the control signal device CSD is provided with a quality control signal input Vq for supplying thereto a quality control signal Vcq. The actual implementation of such control signal device CSD lies within the ability of one skilled in the art and does not need further elaboration.

Figure 5:
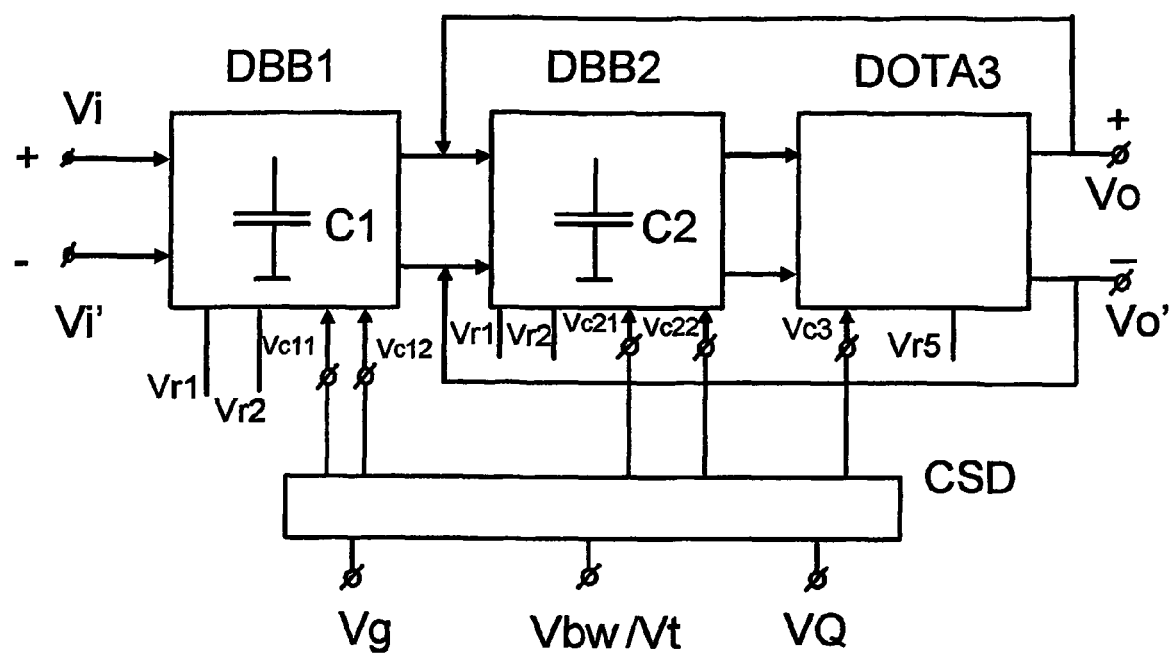
FIG. 5 shows a control system for programmable differential second order high precision bandpass filters according to the invention corresponding to the fully programmable high precision single phase filter of FIG. 3.

FIG. 5 shows a control system for programmable differential second order high precision bandpass filters according to the invention corresponding to the fully programmable high precision single phase filter of FIG. 3. Such differential embodiment of the second order fully programmable high precision filter of FIG. 4A comprises a cascade connection of first and second differential building blocks DBB1 and DBB2 between a differential voltage input Vi and Vi' and a differential voltage output Vo and Vo'. DBB1 and DBB2 are each identical to the differential building block DBB of FIG. 2. The second differential building block DBB2 is negatively fed back from its differential output to its differential input through to a third differential OTA, DOTA3. This DOTA3 comprises a differential pair of OTAs (not shown), each identical to OTA7 of FIG. 4A and coupled respectively through a first and a second differential voltage input terminal to the differential voltage output terminals Vo and Vo' of the second order fully programmable high precision filter and through a second and a first differential voltage input terminal to a fifth DC reference voltage level Vr5. Single ended current outputs of said differential pair of OTAs are coupled to the differential input of DBB2.

Figure 6:
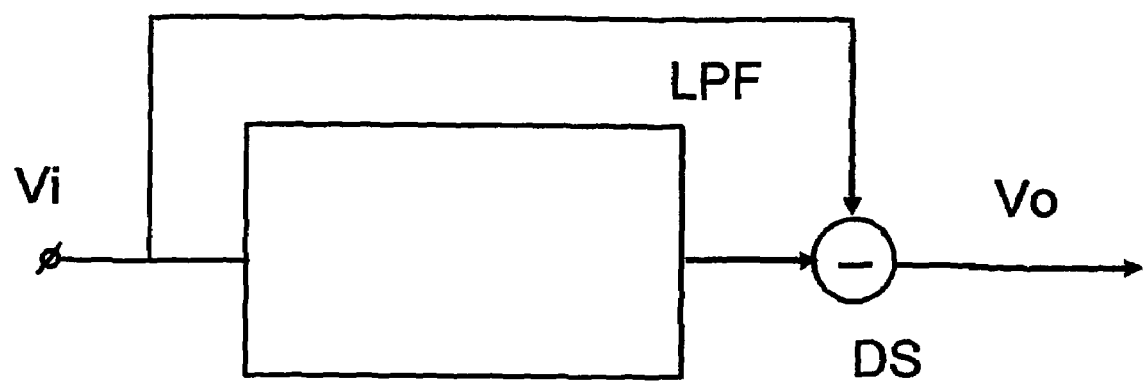
FIG. 6 shows a fully programmable, high precision high pass filter.

The differential embodiment of the second order fully programmable high precision filter is provided with DC reference voltage levels Vr1 and Vr2 and is controllable in its gain, bandwidth or tuning and/or filter quality characteristics by means of a control signal device CSD, similar to the second order fully programmable high precision filter of FIG. 4A FIG. 6 shows a high pass filter with filter input and output terminals Vi and Vo, respectively, comprising a fully programmable high precision filter LPF according to the invention followed by a differential stage DS as well as a feedforward loop from a filter input Vi to said differential stage DS. The differential stage DS provides an output signal to the filter output terminal Vo corresponding to the difference between the output and input signals of the fully programmable high precision filter LPF.

Figure 7:
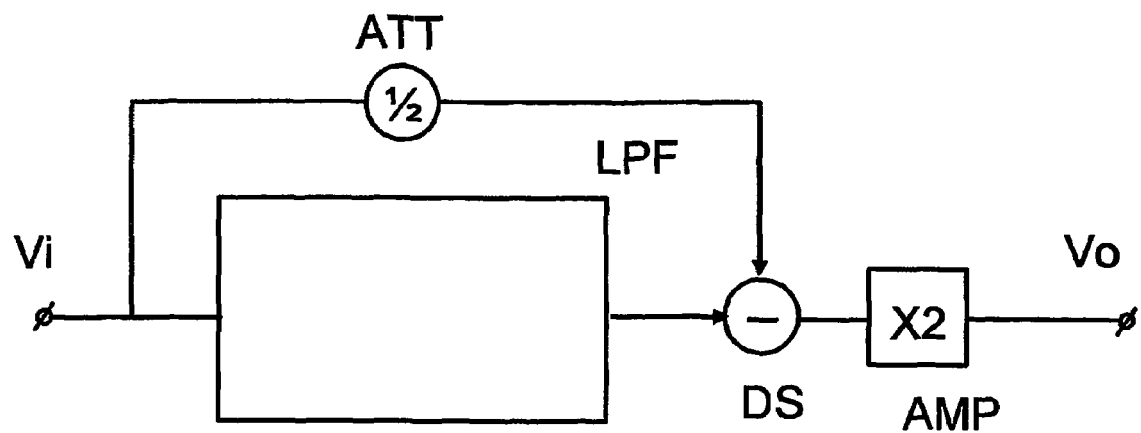
FIG. 7 shows a fully programmable, differential high precision all pass filter.

FIG. 7 shows an all pass filter with filter input and output terminals Vi and Vo, respectively, comprising a fully programmable high precision filter LPF according to the invention followed by a differential stage DS, as well as an attenuator ATT being included in a feedfoward loop from said filter input terminals Vi to said differential stage DS for an attenuation of the filter input signal in said loop with an attenuation factor of 2. The differential stage DS is followed by an amplifier AMP providing amplification of the differential stage output signal by a gain factor corresponding to said attenuation factor, i.e. a gain factor 2, and supplying an all pass filter output signal to the output terminal Vo.

Figure 8:
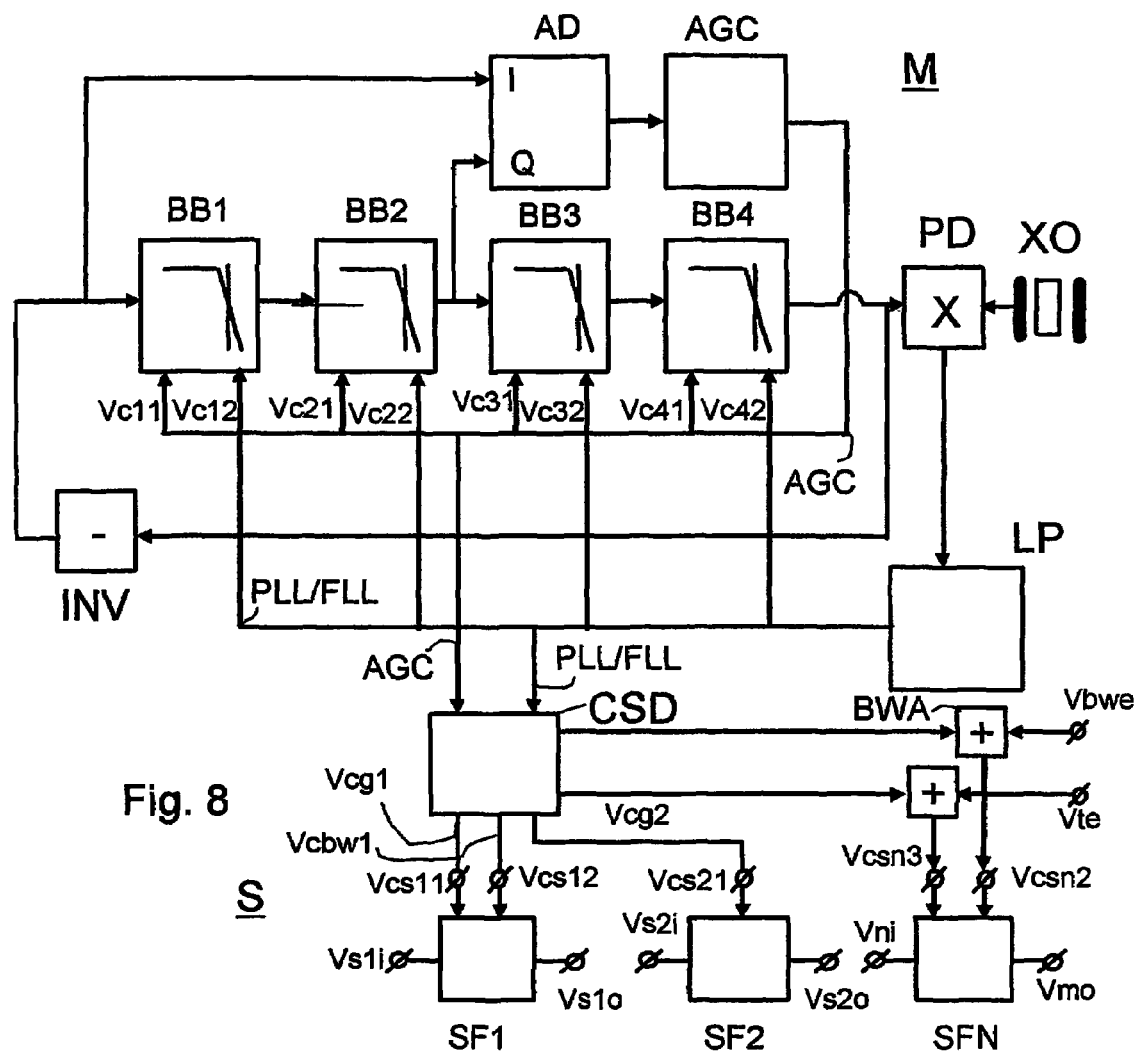
FIG. 8 shows a single phase version of a control system according to the invention based on master-slave calibration using various numbers and types of fully programmable, high precision filters in master and slave.

FIG. 8 shows a single phase version of a control system for programmable filters according to the invention based on master-slave calibration and including a master and a slave device, said master device M providing a frequency calibration signal Vf to a slave filter device S. Said slave filter device S comprises SF1-SFN fully programmable high precision filters in accordance with the invention, each being consituted by one or more fully programmable, high precision first order low pass building block filters being at least in IC topology identical to the fully programmable, high precision first order low pass building block filter BB of FIG. 1 and eventually combined with one or more OTAs each at least in IC topology identical to the OTAs of BB. The slave filters SF1-SFN of the slave filter device S may include low pass, bandpass, high pass or all pass filter types and may mutually differ widely in their gain, bandwidth, tuning frequency and quality filter characteristics by different fixed and/or varying Gm/C values of their Gm/C cells, which filter characteristics may either be fixed or variable with one or more external control signals.

Said master device M includes a master filter device comprising M fully programmable high precision filters in accordance with the invention, which in the embodiment shown are realized with M=4 cascade connected first order low pass building block filters BB1-BB4, each being identical to the first order low pass building block filter BB of FIG. 1. The cascade connected first order low pass building block filters BB1-BB4 are arranged in a regenerative feed back loop to constitute a master oscillator MO, generating a master oscillator signal. The regenerative feed back loop includes an inverter INV which together with a 4×45° phase shift in the master filter device BB1-BB4 gives rise to a positive feedback of the loop signal therewith meeting the phase requirement for oscillation. To meet the unity gain requirement for oscillation, the master oscillator is provided with an automatic gain control (AGC) loop including an amplitude detector AD having a pair of phase quadrature input terminals connected across two of said four cascade connected first order low pass building block filters BB1-BB4, in the embodiment shown across BB1 and BB2. The amplitude detector AD detects the amplitude of the signal processed within the master filter device BB1-BB4 by squaring the amplitudes of its pair of phase quadrature input signals and subsequent summation thereof. The so detected loop signal amplitude is converted in an AGC signal generation circuit AGC into an AGC signal, which is fed back to the first control input terminals Vc11-Vc41 of BB1-BB4 to stabilise a unity signal gain within the regenerative loop. The oscillation frequency within the regenerative loop, i.e. the master oscillator signal frequency, hereinafter also being referred to as master oscillator frequency fmo, is determined by the frequency of the loop signal at which both above gain and phase shift requirements are met.

To calibrate said master oscillator MO at a fixed reference frequency fxo, said master oscillator frequency fmo is frequency locked to said reference frequency fxo through a phase or frequency locked loop, hereinafter referred to as PLL/FLL. In the embodiment shown, use is made of a PLL, whereas the reference frequency fxo is being supplied from a crystal oscillator XO, however such reference frequency fxo may alternatively be derived from any other fixed frequency source. The phase or frequency locked loop PLL/FLL includes a phase detector PD or frequency detector (not shown) receiving said master oscillator frequency fmo and said fixed reference frequency fxo to detect the phase/frequency difference therebetween and to obtain a PLL/FLL signal, which is selected in a low pass loop filter LP. Said low pass loop filter LP is preferably implemented with a first order low pass building block filter identical to each of first order low pass building block filters BB1-BB4. After selection in LP, the PLL/FLL signal is negatively fed back to the second control terminals of the first order low pass building block filters BB1-BB4 of the master filter device. This causes the bandwidth of each of BB1-BB4 to be controlled such, that a phase shift per each first order low pass building block filter BB1 to BB4 of precisely 45° will occur at the reference frequency fxo. The master oscillator MO is therewith calibrated at said reference frequency fxo, independent from element spread or parasitic effects. The phase and gain control signals, i.e. the above PLL/FLL and AGC signals in this state of calibration, are being used to derive therefrom in the control signal device CSD frequency and gain calibration signals Vcf and Vcg to be supplied to bandwidth and/or tuning frequency and/or gain control terminals of said SF1-SFN fully programmable high precision filters of the slave filter device S to calibrate the same against spread and any other technology related sources of unpredictable inaccuracy.

Due to the repetitive use of identical circuitry, the unpredictable inaccuracies of the first to fourth fully programmable high precision filters of the master filter device M occur to a scaled extend in each of said N fully programmable high precision filters SF1-SFN of the slave filter device S and are compensated by the gain and frequency calibration signals derived from said PLL/FLL and AGC signals in said control signal device CSD.

According to the invention, said gain and frequency calibration signals are coupled from said control signal device CSD to each of said N of fully programmable high precision filters of the slave filter device for calibrating each of the first order low pass filter sections of the slave filter device in its Gm/C value at a predetermined scaling factor with respect to the Gm/C value of each of the first order low pass filter sections of the master filter device for a bandwidth, tuning and/or gain calibration thereof. When using bipolar integration technology, the control signal device CSD provides for scaling of transconductance control parameters or Gm scaling through scaling of the emitter tail currents of the OTAs—Itail-master/Itail-slave scaling. Therewith, per each of BB1-BB4 of the master filter device and each of the first order low pass building block filters of each of the N fully programmable high precision filters SF1-SFN of the slave filter device S, calibration at the respective correct Gm-master/Gm-slave scaling factor is being obtained.

Apart therefrom, the control signal device CSD may derive said frequency calibration signal from said PLL/FLL signal and a predetermined filter quality factor Q in accordance with fc=fbw*Q, said frequency calibration signal Vcf being supplied as a tuning frequency calibration signal Vcft to a tuning control terminal of said slave filter device.

Alternatively, the control signal device CSD may derive said frequency calibration signal Vcf from said PLL/FLL signal and may use a divider deriving said frequency calibration signal from said PLL/FLL signal and a predetermined filter quality factor Q in accordance with the quotient fbw=fc/Q, said frequency calibration signal Vcf being supplied as a bandwidth frequency calibration signal Vcbw to a bandwidth control terminal of said slave filter device.

Alternatively, the control signal device CSD may derive a quality control signal Vcq from said PLL/FLL signal through a fixed current ratio.

In the embodiment shown in this FIG. 8 by way of example, slave filter SF1 receives gain and frequency calibration signals Vcg1 and Vcbw1 from the control signal device CSD at its first and second control input terminals Vcs11 and Vcs12. Slave filter SF2 receives a gain calibration signal Vcg2 at its first control input terminal Vcs21, and slave filter SFN receives a summation of a bandwidth calibration signal Vcbwn supplied by the control signal device CSD and an external bandwidth control signal Vcbwe through an external bandwidth control input Vbwe at its second control input terminal Vcsn2 and a summation of a tuning calibration signal Vctn supplied by the control signal device CSD and an external tuning control signal Vcte through an external tuning control input Vte at its third control input terminal Vcsn3. Slave filter SFN may be identical to the fully programmable high precision filter shown in FIG. 4A and may be used in a receiver with reception quality dependent tuning and selectivity variation.

The above scaling of control parameters may be applied instead or in combination with scaling of circuit parameters, such as the capacitance of the capacitor C used in each of BB1-BB4 of the master filter device relative to the capacitance of the capacitor C used in each of the first order low pass building block filters of each of the N fully programmable high precision filters SF1-SFN of the slave filter device S, i.e. Cmaster/Cslave per each master filter and each slave filter.

When using MOS integration technology, scaling of control parameters can be replaced with W-master/W-slave scaling, in which W-master represents the channel width of the OTA transistors used in the master filter and W-slave represents the channel width of the OTA transistors used in the slave filter to be scaled.

Master-slave filter calibration when using MOS integration technology can also be obtained by said scaling factor being determined by a ratio in numbers of identical first order low pass filter sections being arranged in shunt in one or more of the N fully programmable high precision filter of the slave filter device. Or, in other words, by using a shunt arrangements of K identical first order low pass filter sections for each of the N fully programmable high precision filter of the slave filter device S, and by using a shunt arrangements of L identical first order low pass filter sections for each of the M fully programmable high precision filters of the master device M.

Figure 9:
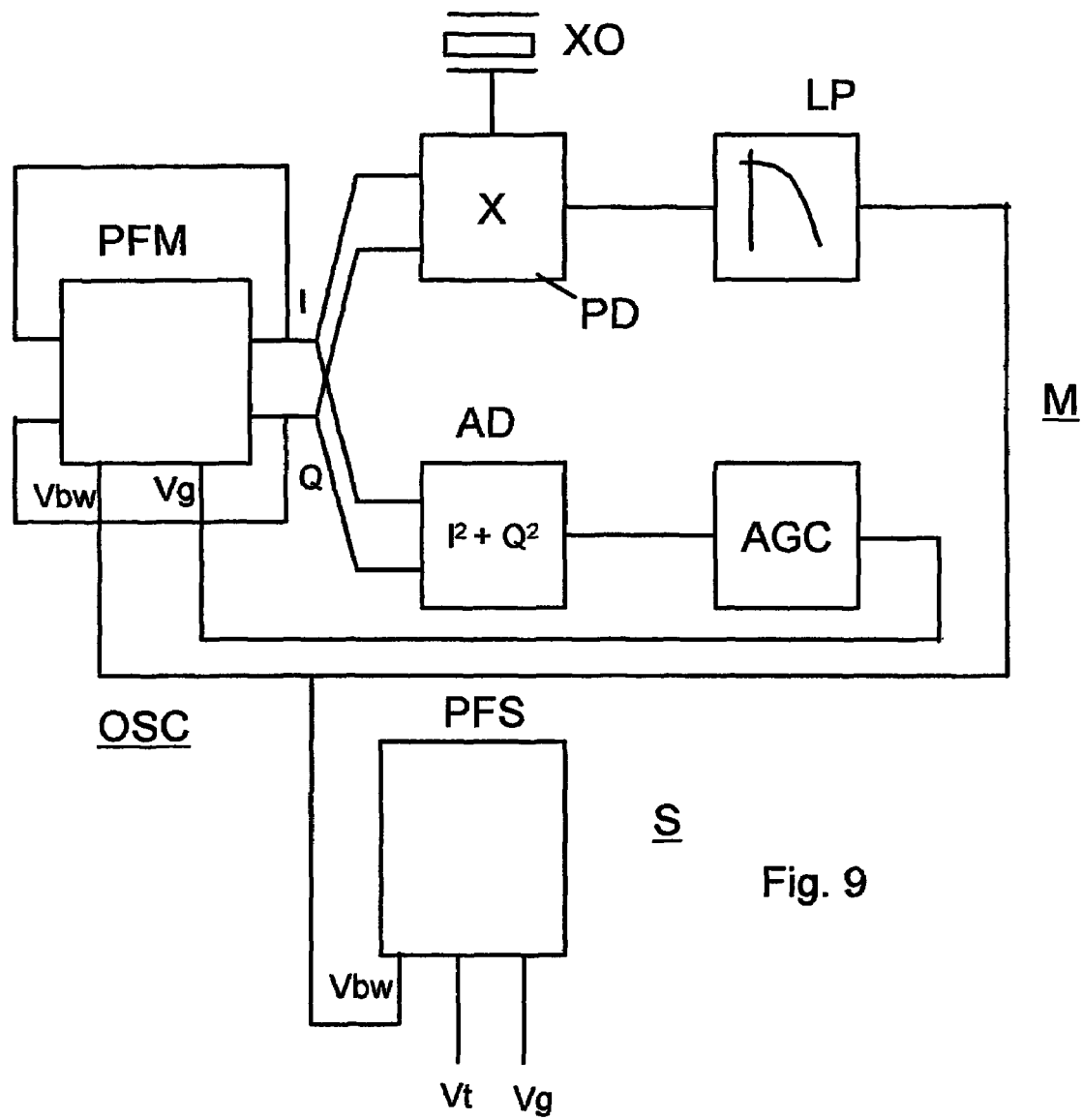
FIG. 9 shows a differential version of a master-slave calibration control system according to the invention.

FIG. 9 shows a polyphase version of a master-slave calibration system according to the invention, the master device M thereof comprising by way of example a fully programmable high precision filter PFM, such as shown in FIG. 3, being positively fed back from its phase quadrature output to its phase quadrature input to provide a regenerative loop or master oscillator OSC. Similar to the master-slave calibration system of FIG. 8, the regenerative loop generates a master oscillator signal, which is frequency coupled through a phase or frequency loop PLL/FLL to a reference frequency fxo being supplied from a fixed frequency source, in the embodiment shown a PLL loop and a crystal oscillator XO are used. The phase detector PD is included in a PLL and provides a PLL signal selected through a low pass loop filter LP to a bandwidth control input of the master oscillator OSC. The phase quadrature output of the oscillator OSC is coupled to an amplitude detector AD included in an AGC loop and providing an AGC signal to the gain control input of the master oscillator OSC. The PLL and AGC signals are being provided to gain and frequency control input terminals of a polyphase slave filter PFS for gain and bandwidth or tuning calibration.

Figure 10:
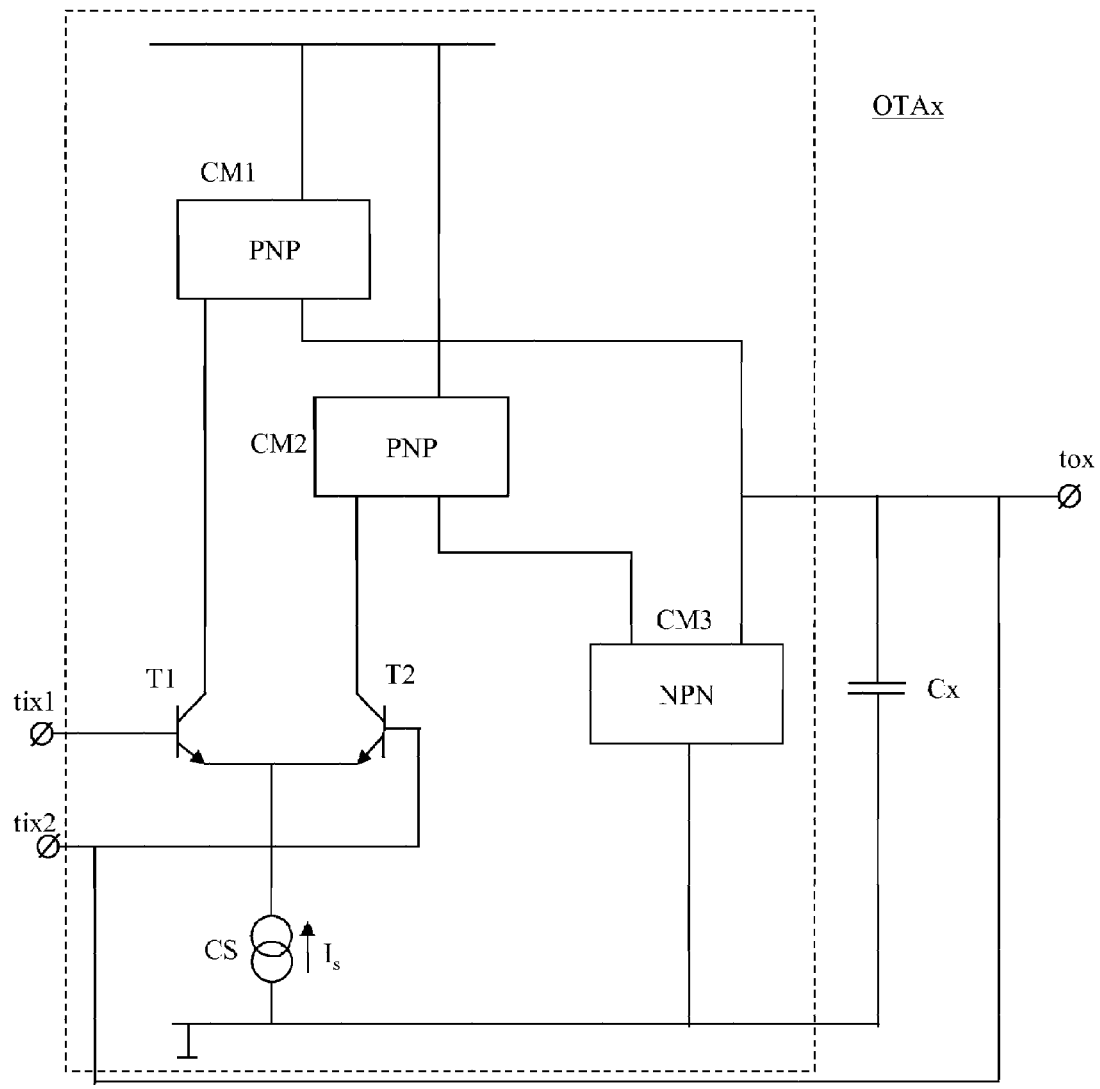
FIG. 10 shows a prior art OTA for use in a fully programmable high precision filter of a control system according to the invention.

FIG. 10 is a circuit diagram of a well known prior art OTAx, which may be used for OTA1 and OTA2 of the programmable high precision low pass building block filter BB of FIG. 1. The single current current of OTAx is resistorless coupled to a capacitor Cx according to the invention. OTAx as shown is on itself known e.g. from National Semiconductor Datasheet on IC type LM13700 Dual Operational Transconductance Amplifiers with Linearizing Diodes and Buffers. It comprises a differential pair of first and second transistors T1 and T2, the base electrodes thereof constituting the differential voltage input terminals of OTAx, tix1 and tix2, respectively. The emitters of T1 and T2 are being coupled in common to controllable emitter tail current source CS defining the transconductance Gm of OTAx. An input signal voltage Vi is coupled to the first differential voltage input terminal tix1 of the transconductance amplifier OTAx being constituted by the base electrode of the first transistor T1. A collector electrode of the first transistor T1 is being coupled through current mirrors CM1-CM3 to the single current output tox of the transconductance amplifier OTAx, said output tox being coupled to a mass connected capacitor Cx, without the use of a physical resistor. The second differential voltage input terminal tix2 of the transconductance amplifier OTAx, is coupled to a first DC reference voltage Vr1. The current mirrors CM1-CM3 are on themselves known, the first and second current mirrors CM1 and CM2 being PNP type current mirrors, the third current mirror CM3 being a NPN type current mirror. The collector electrode of the first transistor T1 is coupled to an input of the first current mirror CM1, in which the collector current of the first transistor T1 is mirrored and available at the output thereof. The collector electrode of the second transistor T2 is coupled to an input of the second current mirror CM2, in which the collector current of the second transistor T2 is mirrored. An output of the second current mirror CM2 is coupled to an input of the third current mirror CM3. The third current mirror CM3 therewith provides an output current substantially equal to the collector current of the second transistor T2. Outputs of both first and third current mirror CM1 and CM3 are commonly coupled to the output tox of the transconductance amplifier OTAx. The output current of the transconductance amplifier OTAx being supplied to the capacitor C, therewith corresponds substantially to the difference between the collector currents of the first and second transistors T1 and T2, varying with the differential input voltage at the differential input tix1, tix2, i.e. the input voltage Vi. The coupling of the single current output of OTAx to the capacitor Cx is therewith resistorless.

Now, the present invention has hereabove been disclosed with reference to preferred embodiments thereof. Persons skilled in the art will recognize that numerous modifications and changes may be made thereto without exceeding the scope of the appended Claims. For example, the master filter device in FIG. 8 may well be implemented with any other number of filters, the AGC and PLL/FLL signals may be supplied to gain and frequency (i.e. bandwidth or tuning frequency) control inputs of said master filters through multipliers to obtain-orthogonal control of parameters, or if acceptable, the use of a control signal device may be dispensed with, etc.

In consequence, the embodiments should be considered as being illustrative, and no restriction should be construed from those embodiments, other than as have been recited in the Claims.

The invention claimed is:

1. A control system for a fully programmable high precision filter having a filter input and a filter output including a first first-order low pass filter section comprising first and second mutually identical operational transconductance amplifiers (OTAs), each having a differential voltage input with first and second differential voltage input terminals and a single current output carrying a single phase current output signal, the first and second OTAs each having a controllable transconductance Gm from the differential voltage input to the single current output and being provided with first and second control inputs, respectively, the filter input being coupled to the first differential voltage input terminal of the first OTA, the current outputs of both first and second OTAs being resistorless coupled to a first capacitor, the current output of the second OTA being negatively fed back to its first differential voltage input terminal to form a variable positive virtual resistance across the first capacitor, the common connection of the single current outputs of the first and second OTAs and the first capacitor constituting an output terminal of the first first-order low pass filter section, which is coupled to the filter output, the second differential voltage input terminals of the first and second OTAs being respectively coupled to first and second DC reference voltage levels, comprising:
a control signal device that is configured to receive an input gain control signal and a bandwidth control signal and includes a first multiplier that is configured to multiply the input gain control signal with the bandwidth control signal to provide an output gain control signal, and
wherein:
the output gain control signal is coupled to the first control input, and
the bandwidth control signal is coupled to the second control input.

2. The control system of claim 1, including:
a second-order low pass filter section comprising a cascade connection of the first first-order low pass filter section with an identical second first-order low pass filter section comprising a second capacitor, identical to the first capacitor, and
a feedback OTA,
wherein:
an output terminal of the second first-order low pass filter section is fed back through the feedback OTA to the common connection between the output terminal of the first first-order low pass filter section and an input terminal of the second first-order low pass filter section,
the feed back OTA is substantially identical to each of the OTAs of the first and second first-order low pass filter sections and is controlled by a feedback control signal through a feedback control input terminal,
the bandwidth control signal is coupled in common to the second control input terminal of the first first-order low pass filter sections, the first and second control input terminals of the second first-order low pass filter section, and the feedback control input terminal of the feedback OTA.

3. The control system of claim 1, including:
a second-order low pass filter section comprising a cascade connection of the first first-order low pass filter section with an identical second first-order low pass filter section comprising a second capacitor, identical to the first capacitor, and
a feedback OTA,
wherein:
an output terminal of the second first-order low pass filter section is fed back through the feedback OTA to the common connection between the output terminal of the first first-order low pass filter section and an input terminal of the second first-order low pass filter section,
the feed back OTA is substantially identical to each of the OTAs of the first and second first-order low pass filter sections and is controlled by a feedback control signal through a feedback control input terminal,
the bandwidth control signal is coupled in common to the second control input terminals of the first and second first-order low pass filter sections, and
a tuning control signal that is substantially larger than the bandwidth control signal is coupled in common to the first control input terminal of the second first-order low pass filter section and the feedback control input terminal.

4. The control system of claim 3, wherein the control signal device includes a second multiplier that is configured to multiply the bandwidth control signal with the tuning control signal to provide the feedback control signal to the feedback control input terminal.

5. A system comprising
a master-slave calibration system that includes:
a master filter device, and
a slave filter device,
wherein:
the master filter device is configured to provide a frequency calibration signal to the slave filter device,
the slave filter device and the master filter device respectively include N and M fully programmable high precision filters that include a control system that provides orthogonal control of gain and frequency characteristics via corresponding gain control and frequency control terminals,
the M fully programmable high precision filters of the master filter device are arranged in a regenerative feedback loop to constitute a master oscillator generating a master oscillator signal, the master oscillator signal being frequency locked to a reference frequency through a phase or frequency locked loop (PLL/FLL) carrying a PLL/FLL signal being fed back to the frequency control terminal of the master filter device and providing the frequency calibration signal,
an automatic gain control (AGC) loop is configured to provide an AGC signal derived from an output amplitude of the master filter device to the gain control terminal of the master filter device, thereby providing a gain calibration signal,
the PLL/FLL signal and the AGC signal are configured to calibrate a phase shift and gain within the regenerative feedback loop to meet oscillation conditions at the reference frequency, and
at least one of the frequency calibration signal and the gain calibration signal is coupled to corresponding frequency and gain control terminals of the N fully programmable high precision filters of the slave filter device for at least one of a bandwidth, tuning, and gain calibration thereof.

6. The system of claim 5, wherein the N fully programmable high precision filters of the slave filter device mutually, as well as with respect to the M fully programmable high precision filters of the master filter device, differ in Gm/C value by predetermined scaling factors and include first-order low pass filter sections that are substantially identical in circuit topology.

7. The system of claim 5, wherein an output of the fully programmable high precision filter is positively fed back to its input to form the regenerative feedback loop.

8. The system of claim 5, wherein
the master filter device includes a cascade arrangement of an even number of first-order low pass filter sections, each first-order low pass filter section including:
a first operational transconductance amplifier having a first transconductance control input and a first output,
a second operational transconductance amplifier having a second transconductance control input and a second output that is directly couple to the first output and to a capacitor, and
a multiplier that is configured to multiply an input gain control signal and a bandwidth control signal to provide the first transconductance control input, the bandwidth control signal being coupled to the second transconductance input; and
the PLL/FLL signal and the AGC signal being supplied to the bandwidth control signal and the input gain control signal, respectively, of each of the first-order low pass filter sections for bandwidth and gain calibration.

9. The system of claim 8, wherein the slave filter device includes a second-order low pass filter section comprising:
a cascade connection of a third and a fourth first-order low pass filter sections, each first-order low pass filter section including:
a first operational transconductance amplifier (OTA) having a first transconductance control input and a first output that is coupled to a capacitor,
a second OTA having a second transconductance control input and a second output that is directly couple to the first output and to an input of the second OTA, and
a multiplier that is configured to multiply an input gain control signal and a bandwidth control signal to provide the first transconductance control input, the bandwidth control signal being coupled to the second transconductance input;
a feedback OTA; and
an other multiplier,
wherein:
an output terminal of the fourth first-order low pass filter section is fed back through the feedback OTA to the output terminal of the third first-order low pass filter section,
the feedback OTA is substantially identical to each of the OTAs of the third and fourth first-order low pass filter sections and is controlled by a feedback control signal, and
the other multiplier is configured to provide the frequency calibration signal by multiplying the PLL/FLL signal and a predetermined filter quality factor Q, the frequency calibration signal being supplied to the feedback control signal.

10. The system of claim 8, wherein the slave filter device includes a second-order low pass filter section comprising:
a cascade connection of a third and a fourth first-order low pass filter sections, each first-order low pass filter section including:
a first operational transconductance amplifier (OTA) having a first transconductance control input and a first output that is coupled to a capacitor,
a second OTA having a second transconductance control input and a second output that is directly couple to the first output and to an input of the second OTA, and
a multiplier that is configured to multiply an input gain control signal and a bandwidth control signal to provide the first transconductance control input, the bandwidth control signal being coupled to the second transconductance input;
a feedback OTA; and
a divider,
wherein:
an output terminal of the fourth first-order low pass filter section is fed back through the feedback OTA to the output terminal of the third first-order low pass filter section,
the feedback OTA is substantially identical to each of the OTAs of the third and fourth first-order low pass filter sections and is controlled by a feedback control signal, and
the divider is configured to divide the PLL/FLL signal by a predetermined filter quality factor Q to provide the frequency calibration signal, the frequency calibration signal being supplied to the feedback control signal.

11. The system of claim 10, characterized by a derivation of a quality control signal from the PLL/FLL signal through a fixed current ratio.

12. The system of claim 5, wherein the frequency and gain calibration signals of the N fully programmable high precision filters of the slave filter device are configured to calibrate Gm/C value of the filters at predetermined scaling factors with respect to the Gm/C value of each of a plurality of first-order low pass filter sections of the master filter device.

13. The system of claim 5, wherein in an implementation in bipolar IC technology, scaling factors of Gm/C values of the filters are substantially determined by a fixed gain control current and/or capacitance ratio.

14. The system of claim 5, including an embodiment that includes metal oxide silicium (MOS) technology, wherein a scaling factor of Gm/C values of the filters is determined by a ratio in channel width of first-order low pass filter sections of the N fully programmable high precision filter of the slave filter device.

15. The system of claim 5, including an embodiment that includes metal oxide silicium (MOS) technology, wherein a scaling factor of Gm/C values of the filters is determined by a ratio in numbers of identical first-order low pass filter sections being arranged in shunt in one or more of the N fully programmable high precision filter of the slave filter device.

16. The system of claim 5, wherein first-order low pass filter sections of both master and slave filter devices each comprising third and fourth OTAs being identical to each of the first and second OTAs and having the first and second control input terminals in common with the first and second OTAs, respectively, the first and third OTAs being arranged to form a first differential OTA having a differential voltage input comprising the first differential voltage input terminals of the first and third OTAs and a differential current output comprising the single current outputs of the first and third OTAs, the second and fourth OTAs being arranged to form a second differential OTA having a differential voltage input comprising the first differential voltage input terminals of the second and fourth OTAs and a differential current output comprising the single current outputs of the second and fourth OTAs, the second and fourth OTAs being negatively fed back from their single current outputs to their first voltage input terminals, respectively, to each form a variable positive virtual resistance across the first capacitor, the first capacitor being resistorless coupled between the common connection of the single current outputs of the first and second OTAs on the one hand and the common connection of the single current outputs of the third and fourth OTAs on the other hand, the common connections respectively constituting first and second differential voltage output terminals of the first first-order low pass filter section, the second voltage input terminals of the first and third OTAs, respectively the second and fourth OTAs, being coupled in common to the first, respectively the second, DC reference voltage levels, the gain and bandwidth control signal being supplied to the first and second control input terminals, respectively, and being arranged to form a polyphase filter device.

17. The system of claim 5, wherein the slave filter device includes a second-order low pass filter section comprising:
a cascade connection of a first and a second first-order low pass filter sections, each first-order low pass filter section including:
a first operational transconductance amplifier (OTA) having a first transconductance control input and a first output that is coupled to a capacitor,
a second OTA having a second transconductance control input and a second output that is directly couple to the first output and to an input of the second OTA, and
a multiplier that is configured to multiply an input gain control signal and a bandwidth control signal to provide the first transconductance control input,
the bandwidth control signal being coupled to the second transconductance input;
a feedback OTA; and
an other multiplier,
wherein:
an output terminal of the second first-order low pass filter section is fed back through the feedback OTA to the output terminal of the first first-order low pass filter section,
the feedback OTA is substantially identical to each of the OTAs of the first and second first-order low pass filter sections and is controlled by a feedback control signal, and
the other multiplier is configured to provide the frequency calibration signal by multiplying the PLL/FLL signal and a predetermined filter quality factor Q, the frequency calibration signal being supplied to the feedback control signal.

18. The system of claim 5, wherein the frequency and gain calibration signals of the N fully programmable high precision filters of the slave filter device are configured to calibrate Gm/C value of the filters at predetermined scaling factors with respect to the Gm/C value of each of a plurality of first-order low pass filter sections of the master filter device.

19. A filter that is configured to receive an input signal and provide a filtered output signal, comprising:
a first first-order filter section that includes:
a first operational transconductance amplifier (OTA),
a second OTA, and
a multiplier,
wherein:
each of the first and second OTAs have an associated transconductance that is controlled by a transconductance control input, and
the first OTA includes a signal input that is configured to receive the input signal, and an output that is configured to provide the filtered output signal, based on the transconductance of the first OTA,
the second OTA having a second transconductance control input and a second output that is directly coupled to the first output and to a first capacitor, and
a multiplier that is configured to multiply an input gain control signal and a bandwidth control signal to provide the first transconductance control input,
the bandwidth control signal being coupled to the second transconductance input.

20. The filter of claim 19, including:
a second-order low pass filter section comprising a cascade connection of the first first-order low pass filter section with an identical second first-order low pass filter section comprising a second capacitor, identical to the first capacitor, and
a feedback OTA,
wherein:
an output terminal of the second first-order low pass filter section is fed back through the feedback OTA to the common connection between the output terminal of the first first-order low pass filter section and an input terminal of the second first-order low pass filter section,
the feedback OTA is substantially identical to each of the OTAs of the first and second first-order low pass filter sections and is controlled by a feedback control signal through a feedback control input terminal,
the bandwidth control signal is coupled in common to the second control input terminal of the first first-order low pass filter sections, the first and second control input terminals of the second first-order low pass filter section, and the feedback control input terminal of the feedback OTA.

* * * * *